United States Patent [19]

Rao et al.

[11] Patent Number: 4,897,613

[45] Date of Patent: Jan. 30, 1990

[54] TEMPERATURE-COMPENSATED CIRCUIT FOR GAAS ECL OUTPUT BUFFER

[75] Inventors: Hayagriva V. Rao, Fairfield, Conn.; Gary A. Picard, Langhorne, Pa.

[73] Assignee: Grumman Corporation, Long Island, N.Y.

[21] Appl. No.: 263,270

[22] Filed: Oct. 27, 1988

[51] Int. Cl.⁴ .......................... H03F 3/45; H03F 3/16
[52] U.S. Cl. .................................... 330/253; 330/256; 330/277; 330/289
[58] Field of Search .............. 330/253, 256, 289, 277, 330/307, 252; 307/491

[56] References Cited

U.S. PATENT DOCUMENTS 3,740,658  6/1973  Loving, Jr. ....................... 330/256
4,050,030  9/1977  Russell ............................. 330/256

Primary Examiner—Steven Mottola
Attorney, Agent, or Firm—Bacon & Thomas

[57] ABSTRACT

A temperature-compensated output buffer is disclosed that incorporates a temperature-compensating network into a GaAs output buffer that has been interfaced to Silicon-based circuitry to regulate the output voltage of the buffer under changing temperature conditions. The temperature-compensating network includes a differential amplifier whose output varies with temperature due to a network of series-connected Schottky diodes. The output of the differential amplifier controls a bleeder MESFET that controls the output voltage of the buffer so that temperature variations do not adversely affect the buffer output.

16 Claims, 1 Drawing Sheet

TEMPERATURE-COMPENSATED CIRCUIT FOR GAAS ECL OUTPUT BUFFER

BACKGROUND OF THE INVENTION

1. Field of the Invention

The present invention relates generally to circuits that electrically compensate for temperature changes, and, more specifically, to circuits that compensate for signal errors induced by temperature changes when a circuit including GaAs elements is interfaced with a circuit containing Silicon-based elements.

2. Description of the Related Art

The majority of electronic systems in production and use today are made using Silicon technology. A systems designer who wants to produce the fastest circuit possible using Silicon-based components would likely use emitter-coupled logic circuitry (ECL), which also provides the advantage of low power consumption.

Faster technologies exist, however, including the popular III–V technology using the likes of Gallium Arsenide (GaAs). GaAs circuits and components, however, suffer from fragility during manufacture, and, thus, are relatively expensive Until GaAs chips are available at lower cost, they will be short in both supply and variety. A designer, therefore, must integrate GaAs technology into ECL circuitry to achieve the highest-speed circuits until GaAs chips are more plentiful.

A problem exists, however, when interfacing the two technologies. Silicon chips behave differently than do GaAs chips when both are operated in the same temperature-varying environment. Since electronic circuits inherently produce heat, the difference in electrical behavior between Silicon chips and GaAs chips in the same circuit due to temperature effects must be compensated. The present invention is designed to obviate the problem.

SUMMARY OF THE INVENTION

The present invention incorporates a temperature-compensating network into a GaAs output buffer interfaced to Silicon-based circuitry to regulate the output voltage and current of the buffer under changing temperature conditions. The buffer includes a differential amplifier stage, an output stage, and the temperature-compensating network that responds with temperature to vary the current and voltage on the output of the differential amplifier stage so that the differing temperature characteristics of GaAs with respect to silicon is properly compensated.

The entire buffer, including the differential amplifier stage, the output stage, and the temperature-compensating network, is designed using metal-semiconductor field-effect transistors (MESFETs) as the control and switching elements. The temperature-compensating network includes a differential amplifier and two voltage dividers whose node voltages vary differently with temperature. The output of the temperature-compensating network differential amplifier controls the gate of a "bleeder" MESFET, which channel is connected to the line connecting the buffer differential amplifier to the output stage. As temperature rises, the bleeder FET shunts less current away from the buffer differential amplifier output line so that a higher output buffer voltage results, in accordance with interface requirements of Silicon ECL technology.

DETAILED DESCRIPTION OF THE PREFERRED EMBODIMENTS

Figure 1:
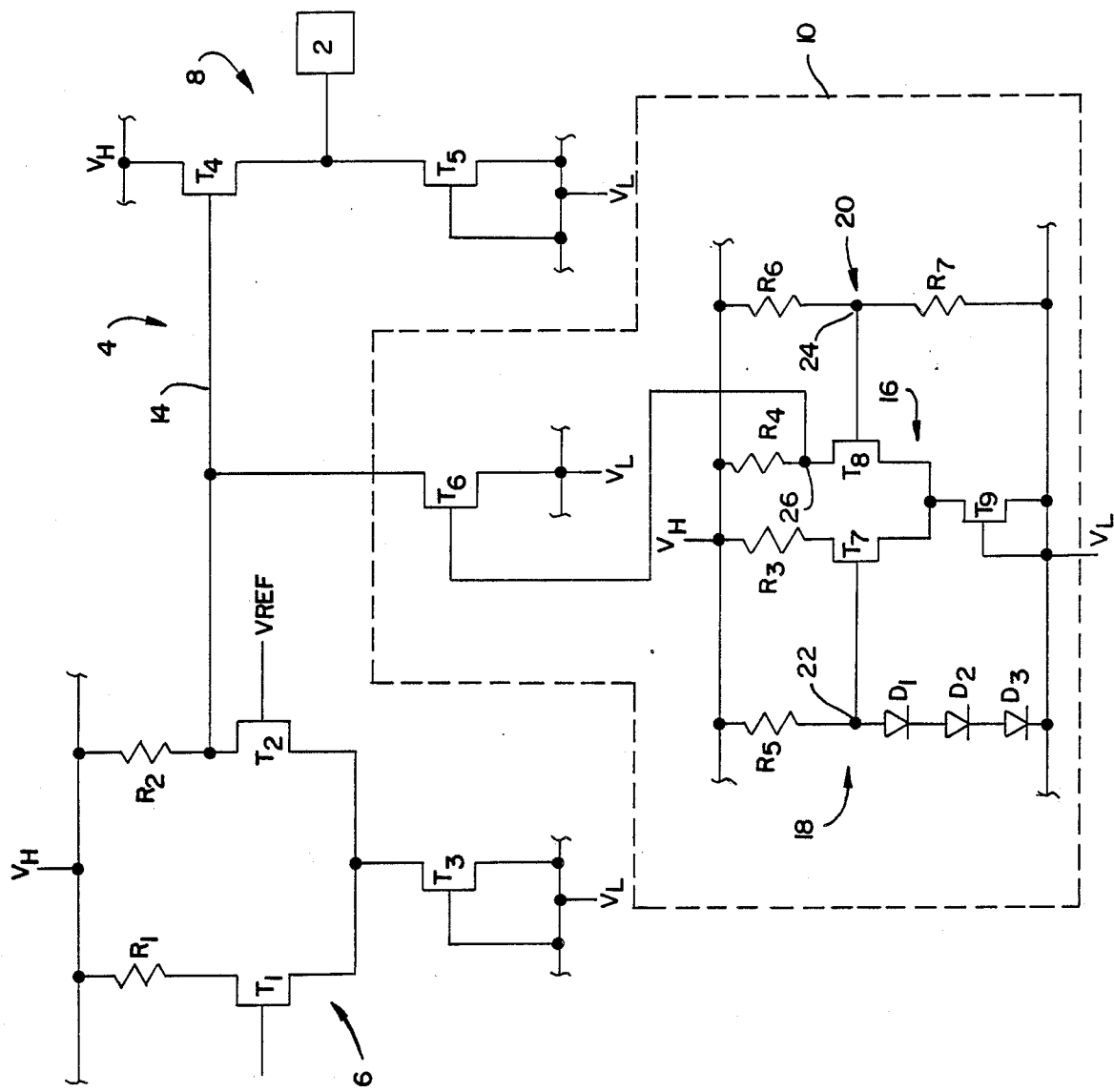
FIG. 1 shows an electrical circuit designed in accordance with the teachings of the present invention.

FIG. 1 shows in detail a preferred embodiment of the present temperature-compensated GaAs output buffer. Output buffer 4 includes differential amplifier stage 6 and output stage 8, the transistors of which are all preferably GaAs MESFETs. The high speed of GaAs components makes them desirable for use in a variety of systems. GaAs circuits, however, respond to variations in temperature differently than do circuits fabricated using Silicon technology. Since GaAs is very expensive at present, and very fragile during chip or wafer manufacture, circuits using GaAs chips are used sparingly. Where used, they must be interfaced with surrounding circuitry so that the effects of temperature variations are reflected uniformly throughout the circuit.

For this reason, the present invention includes temperature-compensating network 10, which operates in conjunction with MESFET $T_6$ to regulate the voltage appearing on buffer differential amplifier output line 14 in response to variations in temperature.

In preferred form, output buffer 4 interfaces with a following Silicon-based circuit stage 2. Differential amplifier 6 comprises MESFETs $T_1$ and $T_2$, whose drains are connected to power supply $V_H$ via resistors $R_1$ and $R_2$, respectively. The sources of $T_1$ and $T_2$ are connected in common to power supply $V_L$ via MESFET $T_3$, which has its gate tied to its source in a known constant-current configuration. The output of stage 2 controls the gate of $T_1$, while the gate of $T_2$ is tied to a reference voltage on the order of $-2.6$ V.

The output of differential amplifier 6 appears at node 14, and is a function of the difference in gate voltages between $T_1$ and $T_2$. Node 14 controls the gate of MESFET $T_4$, of output stage 8. The drain of $T_4$ is connected to $V_H$ MESFET $T_5$ has its gate tied to its source between the source of $T_4$ and $V_L$.

Temperature-compensating network 10 comprises differential amplifier 16, voltage dividers 18 and 20, and "bleeder" MESFET $T_6$. Differential amplifier 16 includes MESFETs $T_7$ and $T_8$, whose drains are tied to $V_H$ via resistors $R_3$ and $R_4$. The sources of $T_7$ and $T_8$ are tied in common to $V_L$ via MESFET $T_9$, which has a constant-current configuration similar to $T_3$.

Voltage divider 18 comprises resistor $R_5$ in series with three series Schottky diodes $D_1$, $D_2$ and $D_3$. Three diodes are preferable by design, although the circuit will operate substantially as designed using fewer or more diodes. Moreover, diodes other than Schottky diodes may perform similarly, but Schottky diodes are preferred for their speed and for their simplicity of manufacture. Node 22 controls the gate of $T_7$. Similarly, reference voltage divider network 20 comprises resistors $R_6$ and $R_7$, with node 24 tied to the gate of $T_8$. The terminals of resistors $R_5$ and $R_6$ that do not comprise nodes 22 and 24, respectively, are tied to $V_H$.

The output of network 10 is taken from node 26, and controls the gate of bleeder FET $T_6$. As temperature increases, the voltages at nodes 22 and 24 differ due to the differing temperature coefficients of the diode network and the resistors. Increased temperature causes decreased voltage at node 22 with respect to node 24, since the series resistance of diodes $D_1$, $D_2$ and $D_3$ decreases with increasing temperature. The ratio of resistances $R_5/R_D$, where $R_D$ is the series resistance of the Schottky diodes, increases in comparison to the ratio $R_6/R_7$. Consequently, the voltage differential between the gates of $T_7$ and $T_8$ changes in favor of $T_8$, resulting in a decrease in voltage at node 26 (more negative).

The decreasing voltage on node 26 increases the resistivity in the channel of bleeder FET $T_6$, which results in decreased conductivity of the channel. As the channel conductivity decreases, the portion of the current drawn from line 14 also decreases. The current drawn through $R_2$ likewise decreases, resulting in a smaller voltage drop across $R_2$, and thus a higher voltage on line 14. Network 10 thus operates to vary the voltage and current on line 14 to make the GaAs buffer compatible with the ECL Silicon circuit.

In the circuit just described, $V_H$ and $V_L$ are set at levels consistent with conventional ECL technology. For example, $V_H$ may be set to 0V and $V_L$ to $-5.2V$. Resistors may comprise resistive regions in the monolithic circuit or may be constructed using FETS having gates tied to sources. The various MESFET pairs are preferably matched for balanced differential pair operation.

The output swings for $V_{OH}$ and $V_{OL}$ vary with temperature, of course, and for ECL 10,000 family, $V_{OH}$ preferably ranges from $-930$ mv to $-1080$ mV at $-55.C°$ C.; from $-810$ mV to $-960$ mV at $25°$ C.; and from $-660$ mV to $-810$ mV at $125°$ C. $V_{OL}$ preferably ranges from $-1770$ mV to $-1970$ mV at $-55°$ C.; from $-1650$ mV to $-1850$ mV at $25°$ C.; and from $-1575$ mV to $-1775$ mV at $125°$ C. The temperature coefficient of $V_{OH}$ is thus about 1.5 mV/$°$ C.; for $V_{OL}$ is about 0.75 mV/$°$ C.

The use of MESFETs instead of conventional JFETs, depletion-mode MOSFETs or other suitable devices is a design choice made in light of the speed advantages achieved by MESFETs. The higher carrier mobilities and carrier saturation velocities of III–V semiconductors such as GaAs or InP in MESFETs give these advantages, making MESFETs especially useful in high-speed digital or microwave applications. Furthermore, GaAs chips can be operated at higher temperatures, and thus higher power levels, than can Silicon chips, and, since no diffusions are necessary (although possible) in MESFETs, close geometrical tolerances may be achieved and the MESFETs made very small. This is especially important at high frequencies, where drift time and stray capacitances must be kept to a minimum.

Various modifications to the invention described above will become apparent to those skilled in the art. All such modifications that basically rely on the teachings through which the invention has advanced the art are properly considered within the spirit and scope of the invention.

We claim:

1. A temperature-compensated output buffer, comprising:
   a first differential amplifier having an output node;
   a bleeder transistor having first and second electrodes and a control terminal, said first electrode electrically connected to the output node of the first differential amplifier; and
   a temperature-compensating electrical network, including a second differential amplifier and a temperature-dependent electrical component having an electrical characteristic that varies with temperature, said temperature-compensating network arranged to output a temperature-dependent signal to the control terminal of said bleeder transistor so that the electrical conductivity between the first and second electrodes of said bleeder transistor changes in response to the varying network output signal, thereby adjusting the output voltage on the output node of the first differential amplifier.

2. A temperature-compensated output buffer as claimed in claim 1, wherein said second differential amplifier includes first and second transistors, said first and second transistors each including first and second electrodes and a control terminal, and wherein said temperature-dependent electrical component has a terminal electrically connected to the control terminal of the first transistor.

3. A temperature-compensated output buffer as claimed in claim 2, wherein said first and second transistors are field-effect transistors.

4. A temperature-compensated output buffer as claimed in claim 2, wherein the output of the temperature-compensating network is derived from the first electrode of the second transistor.

5. A temperature-compensated output buffer as claimed in claim 2, wherein said second differential amplifier output is proportional to the difference between first and second voltage values, said first voltage value appearing at the control terminal of the first transistor, and said second voltage value appearing at the control terminal of the second transistor, wherein said voltage values differ as a result of temperature effects on the temperature-compensating network.

6. A temperature-compensated output buffer as claimed in claim 2, wherein the first transistor control terminal is electrically connected to a first voltage divider node formed by a resistor and a diode network connected in series, and the second transistor control terminal is electrically connected to a second voltage divider node formed by two series-connected resistors.

7. A temperature-compensated output buffer as claimed in claim 2, wherein the temperature-dependent electrical component is a diode.

8. A temperature-compensated output buffer as claimed in claim 1, wherein said bleeder transistor is a field-effect transistor.

9. A temperature-compensated output buffer, comprising:
   a first differential amplifier having an output node;
   a bleeder transistor having first and second electrodes and a control terminal, said first electrode electrically connected to the output node of the first differential amplifier; and
   a temperature-compensating electrical network, including a temperature-dependent electrical component having a different temperature coefficient than that of said bleeder transistor such that the electrical conductivity of said temperature-dependent electrical component varies with changing temperature differently than does the electrical conductivity of said bleeder transistor, said temperature-compensating network arranged to output a temperature-dependent signal to the control terminal of said bleeder transistor so that the electrical conductivity between the first and second electrodes of said bleeder transistor changes in response to the varying network output signal, thereby adjusting the output voltage on the output node of the first differential amplifier.

10. A temperature-compensated output buffer as claimed in claim 9, wherein said temperature-compensating network includes a second differential amplifier having first and second transistors, said first and second transistors each including first and second electrodes and a control terminal, and wherein said temperature-dependent electrical component has a terminal electrically connected to the control terminal of the first transistor.

11. A temperature-compensated output buffer as claimed in claim 10, wherein said first and second transistors are field-effect transistors.

12. A temperature-compensated output buffer as claimed in claim 10, wherein the output of the temperature-compensating network is derived from the first electrode of the second transistor.

13. A temperature-compensated output buffer as claimed in claim 10, wherein said second differential amplifier output is proportional to the difference between first and second voltage values, said first voltage value appearing at the control terminal of the first transistor, and said second voltage value appearing at the control terminal of the second transistor, wherein said voltage values differ as a result of temperature effects on the temperature-compensating network.

14. A temperature-compensated output buffer as claimed in claim 10, wherein the first transistor control terminal is electrically connected to a first voltage divider node formed by a resistor and a diode network connected in series, and the second transistor control terminal is electrically connected to a second voltage divider node formed by two series-connected resistors.

15. A temperature-compensated output buffer as claimed in claim 10, wherein the temperature-dependent electrical component is a diode.

16. A temperature-compensated output buffer as claimed in claim 9, wherein said bleeder transistor is a field-effect transistor.

* * * * *